(12) United States Patent
Nakashima et al.

(10) Patent No.: US 11,557,553 B2
(45) Date of Patent: Jan. 17, 2023

(54) SEMICONDUCTOR DEVICE

(71) Applicant: SUMITOMO ELECTRIC DEVICE INNOVATIONS, INC., Kanagawa (JP)

(72) Inventors: Ikuo Nakashima, Yokohama (JP); Shingo Inoue, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 63 days.

(21) Appl. No.: 16/942,177

(22) Filed: Jul. 29, 2020

(65) Prior Publication Data
US 2021/0035931 A1 Feb. 4, 2021

(30) Foreign Application Priority Data
Aug. 2, 2019 (JP) .............................. JP2019-142839

(51) Int. Cl.
| | |
|---|---|
| H01L 25/18 | (2006.01) |
| H01L 23/66 | (2006.01) |
| H01P 3/08 | (2006.01) |
| H03H 7/38 | (2006.01) |

(Continued)

(52) U.S. Cl.
CPC ............ H01L 23/66 (2013.01); H01L 23/047 (2013.01); H01L 24/32 (2013.01); H01L 24/48 (2013.01); H01L 24/73 (2013.01); H01P 3/081 (2013.01); H03H 7/38 (2013.01); *H01L 2223/6611* (2013.01); *H01L 2223/6627* (2013.01); *H01L 2224/32245* (2013.01); *H01L 2224/48137* (2013.01); *H01L 2224/48175* (2013.01); *H01L 2224/73265* (2013.01); *H01L 2924/1033* (2013.01); *H01L 2924/10253* (2013.01); *H01L 2924/13064* (2013.01); *H01L 2924/13091* (2013.01); *H01L 2924/15747* (2013.01); *H01L 2924/15763* (2013.01); *H01L 2924/17787* (2013.01); *H01L 2924/19032* (2013.01); *H01L 2924/19051* (2013.01)

(58) Field of Classification Search
CPC ..................................................... H01L 23/66
See application file for complete search history.

(56) References Cited

U.S. PATENT DOCUMENTS

2017/0374734 A1* 12/2017 Huang ................... H05K 1/115

FOREIGN PATENT DOCUMENTS

JP 2012-38837 2/2012

* cited by examiner

*Primary Examiner* — Walter H Swanson
(74) *Attorney, Agent, or Firm* — Smith, Gambrell & Russell, LLP.

(57) ABSTRACT

Disclosed is a semiconductor device including a semiconductor die, a base member, a side wall, first and second conductive films, and first and second conductive leads. The base member has a conductive main surface including a region that mounts the semiconductor die. The side wall surrounds the region and is made of a dielectric. The side wall includes first and second portions. The first and second conductive films are provided on the first and second portions, respectively and are electrically connected to the semiconductor die. The first and second conductive leads are conductively bonded to the first and second conductive films, respectively. At least one of the first and second portions includes a recess on its back surface facing the base member, and the recess defines a gap between the at least one of the first and second portions below the corresponding conductive film and the base member.

15 Claims, 10 Drawing Sheets

(51) Int. Cl.
*H01L 23/00* (2006.01)
*H01L 23/047* (2006.01)

SEMICONDUCTOR DEVICE

CROSS-REFERENCE TO RELATED APPLICATIONS

This application is based upon and claims the benefit of priority from Japanese Patent Application No. 2019-142839, filed on Aug. 2, 2019, the entire contents of which are incorporated herein by reference.

TECHNICAL FIELD

The present disclosure relates to a semiconductor device.

BACKGROUND

JP2012-038837A discloses a package for air-tightly sealing a semiconductor die in a semiconductor device for high-frequency use, for example. The package includes a base having a metal main surface, a dielectric side wall having a bottom surface bonded to the main surface of the base, and metal leads bonded to an upper surface on a side opposite to the bottom surface of the side wall. For electrical connection between an external circuit for the semiconductor device and the semiconductor die, the metal leads extend laterally from the upper surface of the side wall in the package.

SUMMARY

The present disclosure provides a semiconductor device. The semiconductor device includes a semiconductor die, a base member, a side wall, a first conductive film, a second conductive film, a first conductive lead, and a second conductive lead. The base member has a conductive main surface including a region that mounts the semiconductor die thereon. The side wall is provided on the conductive main surface of the base member and surrounds the region of the conducive main surface. The side wall is made of a dielectric. The side wall includes a first portion and a second portion sandwiching the region therebetween. The first conductive film is provided on the first portion of the side wall and is electrically connected to the semiconductor die. The second conductive film is provided on the second portion of the side wall and is electrically connected to the semiconductor die. The first conductive lead is conductively bonded to the first conductive film on the first portion of the side wall. The second conductive lead is conductively bonded to the second conductive film on the second portion of the side wall. In the semiconductor device, at least one of the first portion and the second portion of the base member includes a recess on a back surface thereof facing the base member, and the recess is configured to define a gap between the at least one of the first portion and the second portion of the side wall below the corresponding conductive film thereto and the base member.

BRIEF DESCRIPTION OF THE DRAWINGS

The foregoing and other purposes, aspects and advantages will be better understood from the following detailed description of embodiments of the disclosure with reference to the drawings, in which:

FIG. 3 is a cross-sectional view of the semiconductor device along line III-III as shown in FIG. 2, FIGS. 4A and 4B are views for describing examples of effects of the embodiment, in which

DETAILED DESCRIPTION

Figure 1:
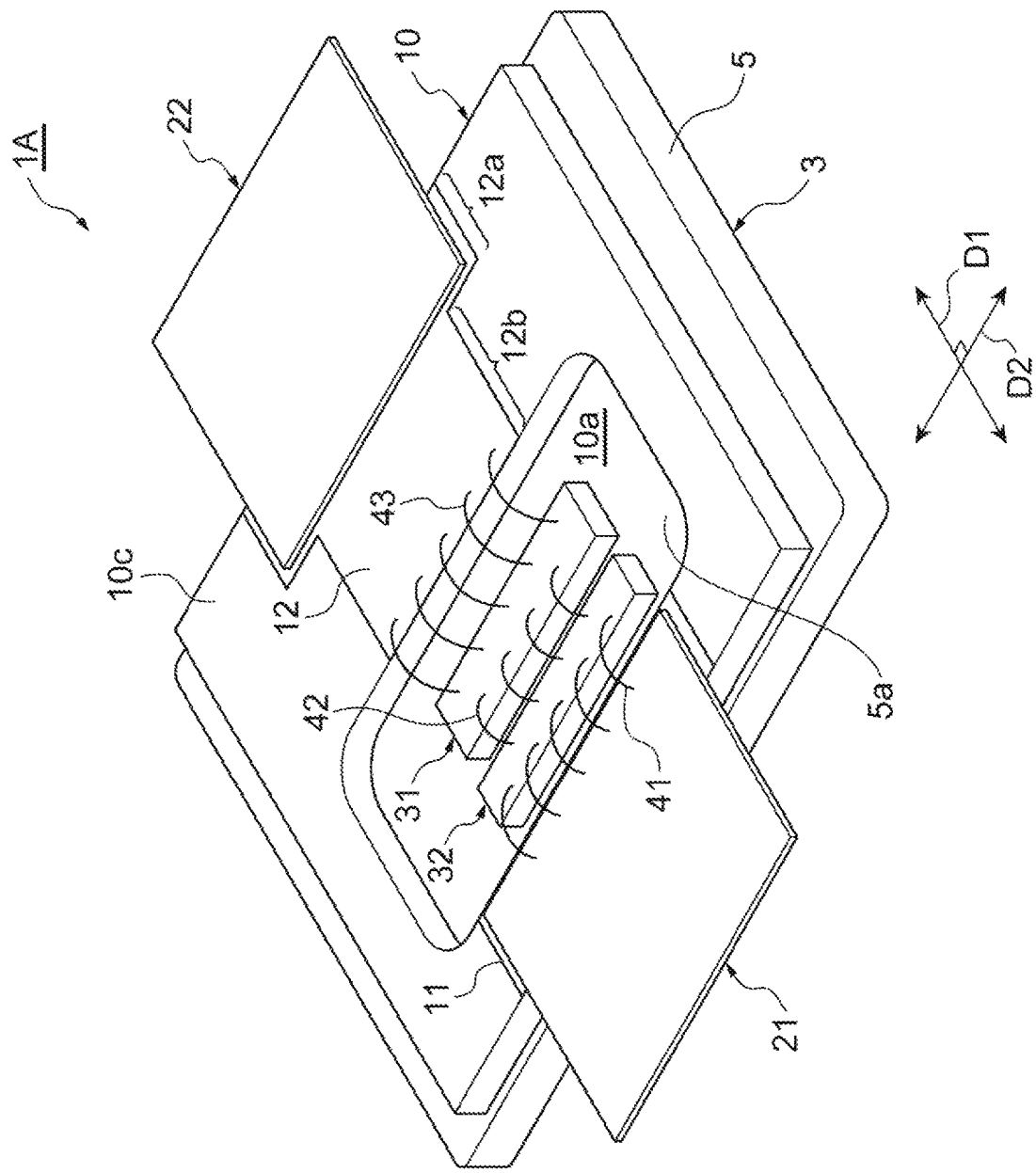
FIG. 1 is a perspective view showing a semiconductor device according to an embodiment of the present disclosure.

Problem to be Solved by the Present Disclosure

When a semiconductor device with a built-in semiconductor die is mounted on a wiring substrate, the electrical length of each of wirings connected to an input side and an output side of the semiconductor die becomes important depending on the frequency of a signal input and output with respect to the semiconductor die. When the signal frequency is relatively high (for example, 100 MHz or higher), an impedance matching the semiconductor die can be achieved by appropriately setting the electrical lengths. Thus, a loss of a signal can be reduced and deterioration of a signal waveform can be curbed.

In a package in the related art, a dielectric side wall is disposed between a base and a lead, and these constitute a microstrip line (MSL). Outside a package, an MSL is constituted of a dielectric substrate (for example, of glass epoxy) constituting a wiring substrate and wiring patterns provided at the front and the rear of the dielectric substrate, and an external matching circuit is constituted of this MSL and a capacitor. The foregoing electrical lengths are determined depending on the lengths of these MSLs. The length of the MSL in a package depends on the size of the package. In order to facilitate mounting of a semiconductor device, it is desirable that the package size be uniform. Thus, in the related art, the electrical length is set appropriately by adjusting the length of the MSL of a wiring substrate.

However, due to various limitations, it may be difficult to appropriately set the electrical length of an MSL with only a wiring substrate. For example, since a dielectric substrate constituting a wiring substrate is considerably thicker than a side wall of a package of a semiconductor device, the electrostatic capacity of the MSL of the wiring substrate is relatively small. Thus, the MSL of a wiring substrate tends to be longer than the MSL of a package. If the MSL of a wiring substrate becomes long, an area necessary for an external matching circuit in the wiring substrate increases. Further, this leads to increase in size of the entire device including a wiring substrate.

Effect of the Present Disclosure

According to an aspect of the present disclosure, an electrical length of an MSL of a package can be further elongated (or shortened) regardless of a package size, and the electrical length can be easily adjusted.

Description of Embodiments of the Present Disclosure

Embodiments of the present disclosure will be enumerated and described. According to one embodiment of the present disclosure, there is provided a semiconductor device including a semiconductor die, a base member, a side wall, a first conductive film, a second conductive film, a first conductive lead, and a second conductive lead. The base member has a conductive main surface including a region that mounts the semiconductor die thereon. The side wall is provided on the conductive main surface of the base member and surrounds the region of the conducive main surface. The side wall is made of a dielectric. The side wall includes a first portion and a second portion sandwiching the region therebetween. The first conductive film is provided on the first portion of the side wall and is electrically connected to the semiconductor die. The second conductive film is provided on the second portion of the side wall and is electrically connected to the semiconductor die. The first conductive lead is conductively bonded to the first conductive film on the first portion of the side wall. The second conductive lead is conductively bonded to the second conductive film on the second portion of the side wall. In the semiconductor device, at least one of the first portion and the second portion of the base member includes a recess on a back surface thereof facing the base member, and the recess is configured to define a gap between the at least one of the first portion and the second portion of the side wall below the corresponding conductive film thereto and the base member.

In this semiconductor device, the side wall has a recess on the surface facing the base member. A gap formed by the recess is present between the side wall below the first or second conductive film and the base member. Accordingly, a third conductive film electrically connected to the main surface of the base member can be provided on an inner surface of this recess. When such a third conductive film is provided, the thickness of a dielectric of a microstrip line (MSL) in the portion becomes thinner than those in other portions, and thus the electrostatic capacity of the MSL increases. As a result, the electrical length can be elongated. That is, the electrical length of an MSL of a package can be further elongated regardless of the package size, and the electrical length of the entire MSL including a wiring substrate can be easily adjusted. In addition, when such a third conductive film is not provided on the inner surface of the recess, since the dielectric constant of the gap (air) is smaller than the dielectric constant of the side wall, the electrostatic capacity of the MSL in the portion becomes smaller than those in other portions. As a result, the electrical length can be shortened. That is, the electrical length of an MSL of a package can be further shortened regardless of the package size, and the electrical length of the entire MSL including a wiring substrate can be easily adjusted.

As one embodiment, the semiconductor device may further include a third conductive film provided on an inner surface of the recess. The third conductive film may be electrically connected to the main surface of the base member. In this embodiment, as described above, the thickness of a dielectric of an MSL in a portion where a gap is present becomes thinner than those in other portions, the electrostatic capacity of the MSL increases, and thus the electrical length can be elongated. That is, the electrical length of an MSL of a package can be further elongated regardless of the package size, and the electrical length of the entire MSL including a wiring substrate can be easily adjusted. In this embodiment, the first conductive film, the first portion of the side wall and a part of the main surface of the base member may constitute a first microstrip line, and the second conductive film, the second portion of the side wall and a part of the main surface of the base member may constitute a second microstrip line, when the second portion includes the recess. A characteristic impedance of the second microstrip line in a part overlapping the recess when viewed in a normal direction to the main surface may be at least 10% smaller than a characteristic impedance of the first microstrip line or of the second microstrip line in a different part not overlapping the recess in the normal direction.

As one embodiment, in the semiconductor device, no conductive film may be provided on the inner surface of the recess between the side wall and the base member. In this embodiment, as described above, since the dielectric constant of the gap (air) is smaller than the dielectric constant of the side wall, the electrostatic capacity of the MSL in a part where the gap is present becomes smaller than those in other parts, and thus the electrical length can be shortened. That is, the electrical length of an MSL of a package can be further reduced regardless of the package size, and the electrical length of the entire MSL including a wiring substrate can be easily adjusted. In this embodiment, the first conductive film, the first portion of the side wall and a part of the main surface of the base member may constitute a first microstrip line, and the second conductive film, the second portion of the side wall and a part of the main surface of the base member may constitute a second microstrip line, when the second portion includes the recess. A characteristic impedance of the second microstrip line in a part overlapping the recess when viewed in a normal direction to the main surface may be at least 10% higher than a characteristic impedance of the first microstrip line or of the second microstrip line in a different part not overlapping the recess in the normal direction.

As one embodiment, in the semiconductor device, a width of the recess provided in the second portion may be equal to or wider than a half of a width of the second portion of the side wall, in a direction intersecting the extending direction of the second portion of the side wall. In this way, the amount of change in the electrical length of the MSL increases by setting the ratio of the gap to the width of the side wall (the second portion) to a relatively significant amount, and thus the adjustment range of the electrical length can be elongated.

As one embodiment, in the semiconductor device, at least one of both ends of the recess provided in the second portion maybe be closed in a direction intersecting the extending direction of the second portion of the side wall. In this embodiment, deterioration in mechanical strength of the side wall caused by providing the gap can be curbed. In addition, the sealing state of the package can be maintained.

As one embodiment, in the semiconductor device, a thickness of the second portion that includes the recess in a part where the recess is formed may be equal to or larger than 30% of the thickness of the side wall in a different part. In this embodiment, deterioration in mechanical strength of the side wall caused by providing the gap can be curbed.

As one embodiment, in the semiconductor device, a width of the recess provided in the second portion may be wider than a width of the second conductive film in an extending direction of the second portion so that the recess spreads out of both ends of the second conductive film when viewed from a normal direction to the main surface. In this embodiment, signal transmission characteristics of the MSL can be made uniform throughout the entire width of the second conductive film, and influences on a signal waveform or the like can be curbed.

As one embodiment, the second conductive film may include an outer portion positioned near an outer edge of the second portion, and an inner portion positioned near an inner edge of the second portion. The inner portion may have a shorter width than a width of the outer portion in an extending direction of the second portion that includes the recess. The inner portion of the second conductive film may overlap the recess when viewed from a normal direction to the main surface. In this embodiment, the width of the outer portion of the second conductive film may be substantially same as a width of the first conductive film in an extending direction of the second portion. A length of the inner portion of the second conductive film may be longer than a length of the outer portion of the second conductive film in a direction intersecting an extending direction of the second portion.

As one embodiment, a width of the second portion that includes the recess may be longer than a width of the first portion in a direction intersecting an extending direction of the second portion. As another embodiment, a length of the second conductive film may be longer than a length of the first conductive film in a direction intersecting an extending direction of the second portion that includes the recess. As further anther embodiment, the semiconductor device may further include a matching circuit disposed on the region of the conductive main surface of the base member between the semiconductor die and the first portion of the side wall. The semiconductor die may be electrically connected to the first conductive lead through the matching circuit so that the matching circuit performs impedance matching between the semiconductor die and the first conductive lead.

Description of Embodiment of Present Disclosure

Specific examples of a semiconductor device of the present disclosure will be described below with reference to the drawings. The present invention is not limited to these examples. The present invention is indicated by the claims, and it is intended to include all changes within meanings and a range equivalent to the claims. In the following description, the same reference numbers are assigned to the same components or to similar components having the same function in description of the drawings, and overlapping description will be omitted.

Figure 2:
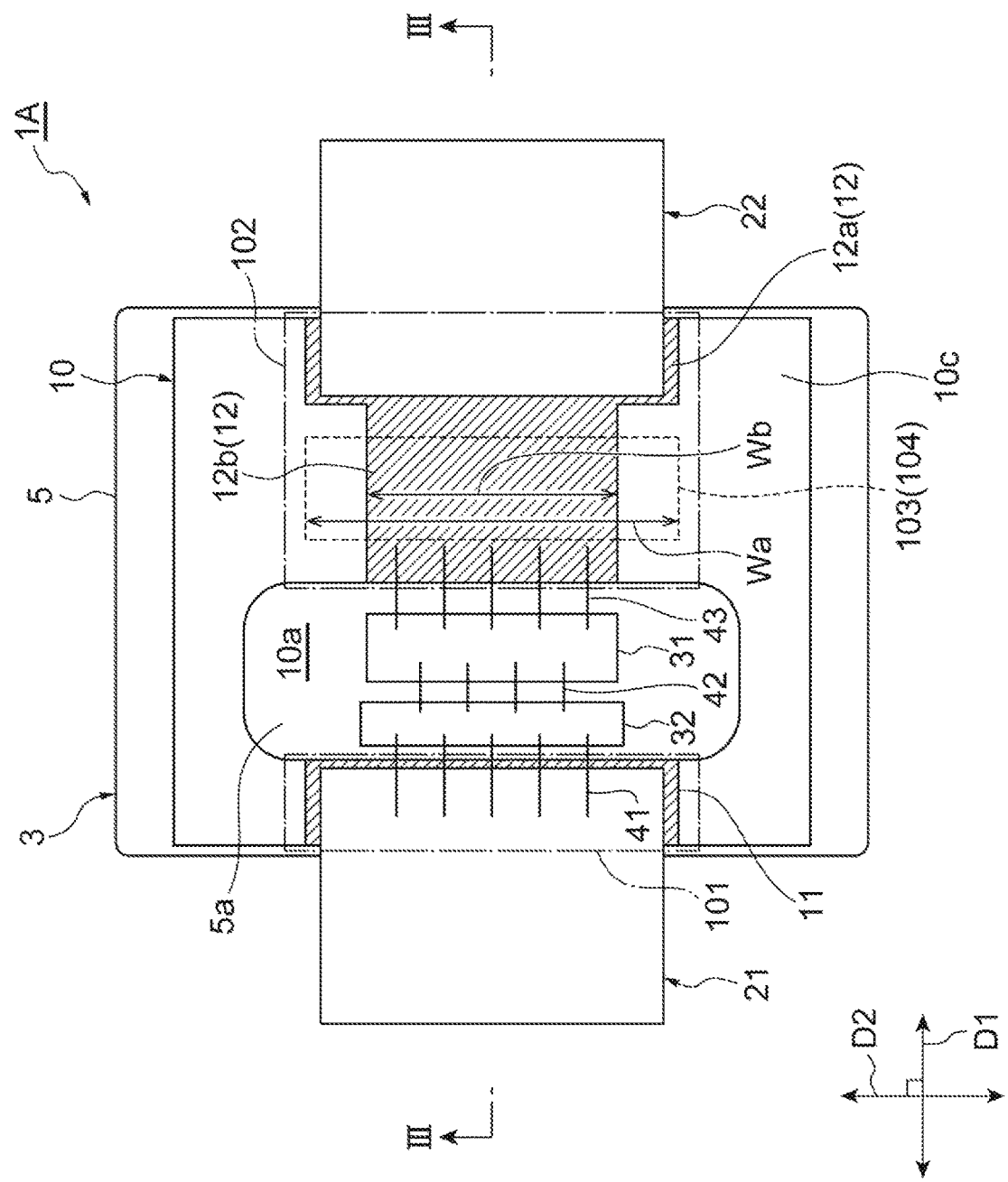
FIG. 2 is a plan view of the semiconductor device shown in FIG. 1.
Figure 3:
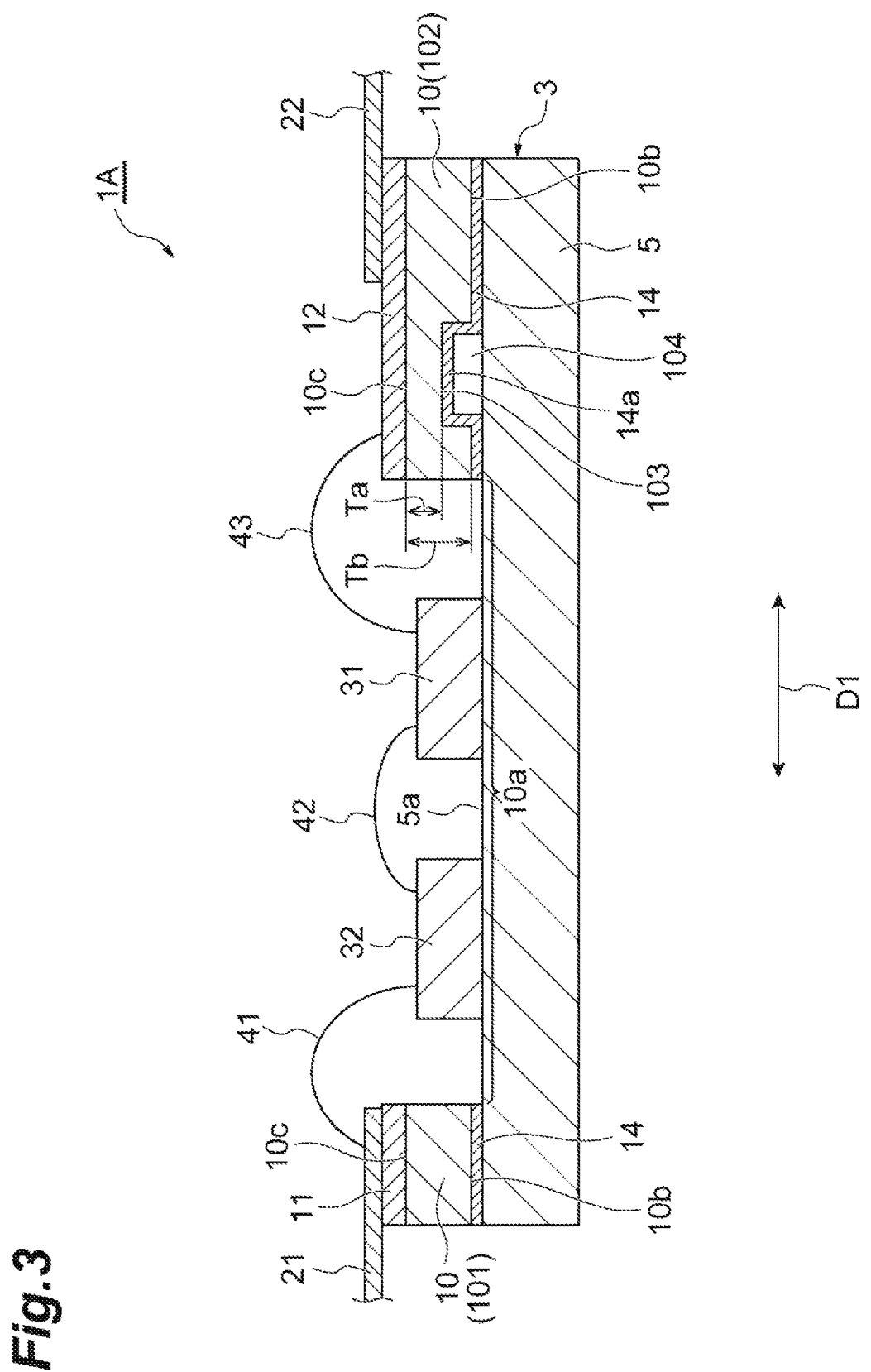

FIG. 1 is a perspective view showing of a semiconductor device according to an embodiment of the present disclosure. FIG. 2 is a plan view of the semiconductor device shown in FIG. 1. FIG. 3 is a cross-sectional view of the semiconductor device along line III-III as shown in FIG. 2. A semiconductor device 1A of the present embodiment is a transistor device which is driven at a high frequency within a range of 2.11 GHz to 2.17 GHz, for example. As shown in FIGS. 1 to 3, the semiconductor device 1A includes a transistor 31 serving as a semiconductor die, a matching circuit 32, and a package 3 for accommodating the transistor 31 and the matching circuit 32. In FIGS. 1 to 3, a lid (cap) of the package 3 is not shown in the diagrams.

The package 3 has a base member 5, a side wall 10, a first conductive film 11, a second conductive film 12, a third conductive film 14, an input lead 21 (first lead), and an output lead 22 (second lead).

The base member 5 is a plate-shaped member having a flat conductive (for example, made of a metal) main surface 5a. The main surface 5a includes a region that mounts the transistor 31 and the matching circuit 32 thereon and is typically regulated to have a reference potential (GND potential). For example, the base member 5 is constituted of a laminated material of copper, an alloy of copper and molybdenum, an alloy of copper and tungsten, a copper plate, a molybdenum plate, a tungsten plate, an alloy plate of copper and molybdenum, or an alloy plate of copper and tungsten. In an example, the base member 5 has a structure in which an alloy plate of copper and molybdenum is sandwiched between two copper plates. The front surface of a base material of the base member 5 is subjected to plating with nickel-chromium(nichrome, NiCr)-gold, nickel(Ni)-gold, nickel-palladium-gold, silver or nickel, nickel-palladium, or the like. Gold, silver, and palladium are plating materials, and NiCr, Ni, and the like are seed materials. Adhesion can be enhanced when a plating material and a seed material are included compared to a case of only a plating material. The thickness of the base member 5 is within a range of 0.5 mm to 1.5 mm, for example. The surface shape of the base member 5 is a rectangular shape having a direction D2 along the main surface 5a as a longitudinal direction, for example.

The side wall 10 is a frame-shaped member made of a dielectric. For example, the dielectric of the side wall 10 is a ceramic, such as alumina. The side wall 10 is provided on the main surface 5a of the base member 5 and surrounds the region for mounting the transistor 31 and the matching circuit 32. More specifically, the side wall 10 has a cavity 10a, and the transistor 31 and the matching circuit 32 are disposed inside the cavity 10a. The surface shape of the cavity 10a is a rectangular shape having four rounded corners, for example. The cavity 10a is formed near the input lead 21 in a direction D1 intersecting (for example, orthogonal to) the direction D2 along the main surface 5a. For example, the thickness of the side wall 10 is within a range of 0.2 mm to 2 mm and is 0.508 mm in one example.

As shown in FIG. 3, the side wall 10 has a back surface 10b facing the main surface 5a of the base member 5. The conductive film 14 is formed on the entire back surface 10b and is firmly fixed to the back surface 10b. For example, the conductive film 14 is a metal film (specifically, an alloy of titanium-tungsten, nickel-chromium, or the like or a Cu film subjected to plating with Au or Ni). The conductive film 14 is bonded to the main surface 5a of the base member 5 with a conductive bonding material therebetween. For example, the bonding material is a sintered metal paste. The sintered metal paste is a silver paste including a silver filler and a solvent. The silver filler used for the bonding material has a particle size considerably smaller than the particle size of a silver filler contained in a silver paste known in the related art.

The side wall 10 has an upper surface 10c on a side opposite to the back surface 10b. The conductive films 11 and 12 are formed on the upper surface 10c and are firmly fixed to the upper surface 10c. For example, the conductive films 11 and 12 are metal films (specifically, a tungsten-Cu film subjected to plating with Au or Ni). In order to facilitate understanding, the range over which the conductive films 11 and 12 are present in FIG. 2 is indicated by hatching. The side wall 10 includes a pair of portions 101 and 102 sandwiching the region on the main surface 5a for mounting the transistor 31 and the matching circuit 32 therebetween (in other words, sandwiching the cavity 10a therebetween) (refer to FIGS. 2 and 3). Each of the first portion 101 and the second portion 102 extends in the direction D2. The conductive film 11 is provided on the first portion 101 and extends from one end to the other end of the first portion 101 in the direction D1. The conductive film 12 is provided on the second portion 102 and extends from one end to the other end of the second portion 102 in the direction D1.

Since the cavity 10a is formed near the first portion 101, the width of the first portion 101 in the direction D1 is smaller than the width of the second portion 102 in the same direction. Accordingly, the length of the conductive film 11 in the direction D1 is shorter than the length of the conductive film 12 in the same direction. The conductive film 12 includes an outer portion 12a and an inner portion 12b. The outer portion 12a has the same width and the same length as the conductive film 11 and is positioned on an outer edge side of the second portion 102. The inner portion 12b is positioned on an inner edge side (near cavity 10a) of the second portion 102 with respect to the outer portion 12a. The length of the inner portion 12b in the direction D1 is longer than the length of the outer portion 12a in the same direction. In addition, a width Wb of the inner portion 12b in the direction D2 is narrower than the width of the outer portion 12a in the same direction. The inner portion 12b is referred to as a transmission line (TRL).

As shown in FIGS. 2 and 3, a recess 103 is formed on the back surface 10b of the second portion 102 of the side wall 10. The recess 103 has a rectangular or square cross-sectional shape having a flat bottom surface facing the main surface 5a and flat side walls surrounding the bottom surface. The recess 103 defines a gap 104 between the side wall 10 and the main surface 5a of the base member 5. The recess 103 (the gap 104) is provided at a position overlapping the conductive film 12 when viewed in a normal direction to the main surface 5a. In the present embodiment, the recess 103 is provided at a position overlapping the inner portion 12b of the conductive film 12. In an example, the width of the recess 103 (that is, the width of the gap 104) in the direction D1 may be equal to or larger than half the width of the second portion 102 in the same direction.

In the present embodiment, both ends of the recess 103 in the direction D1 are closed. In other words, one end of the recess 103 adjacent to the cavity 10a in the direction D1 does not lead to the cavity 10a, and a part of the side wall 10 is interposed between the one end and the cavity 10a. The other end of the recess 103 on a side opposite to the cavity 10a in the direction D1 does not lead to the external space of the package 3, and a part of the side wall 10 is interposed between the other end and the external space of the package 3.

A thickness Ta of the side wall 10 in a part where the recess 103 is formed may be equal to or larger than 30% of a thickness Tb of the side wall 10 in a different part, or may be equal to or larger than 50% thereof. This is because deterioration in mechanical strength of the side wall 10 caused by providing the gap 104 is curbed. However, if the mechanical strength of the side wall 10 is ensured using different means or the like, the thickness of the side wall 10 in the part where the recess 103 is formed may be smaller than 30% of the thickness of the side wall 10 in a different part. In addition, as shown in FIG. 2, a width Wa of the recess 103 in the direction D2 is wider than the width Wb of the conductive film 12 in the same direction. The recess 103 spreads out of both ends of the conductive film 12 in the direction D2 when viewed in the normal direction of the main surface 5a.

A portion 14a of the conductive film 14 is provided on an inner surface, which can include a bottom surface and side surfaces, of the recess 103. The portion 14a comes into contact with the inner surface of the recess 103 and is firmly fixed to the inner surface. As described above, the conductive film 14 is bonded to the main surface 5a with a conductive bonding material therebetween. Accordingly, the portion 14a provided on the inner surface of the recess 103 is also electrically connected to the main surface 5a. Examples of a method for forming a portion 14a include vapor deposition, sputtering, pattern printing, and plating.

The conductive film 11, the first dielectric portion 101, and a part of the main surface 5a of the base member 5 constitute a first MSL on an input side. The electrical length and the characteristic impedance of the first MSL on the input side are determined depending on the length of the conductive film 11 in the direction D1, the width of the conductive film 11 in the direction D2, and the dielectric constant and the thickness of the first portion 101. Similarly, the conductive film 12, the second dielectric portion 102, and a part of the main surface 5a of the base member 5 constitute a second MSL on an output side. The electrical length and the characteristic impedance of the second MSL on the output side are determined depending on the length of the conductive film 12 in the direction D1, the width of the conductive film 12 in the direction D2, and the dielectric constant and the thickness of the second portion 102. As described above, since the recess 103 is formed between the second portion 102 and the main surface 5a, and the portion 14a of the conductive film 14 is formed on the inner surface of the recess 103, the thickness of the second portion 102 becomes thinner in the part where the recess 103 is formed, and thus the electrostatic capacity increases. Therefore, in the part, the electrical length of the second MSL per unit length becomes longer than those in other portions, and thus the characteristic impedance deteriorates. In the present embodiment, the characteristic impedance of the second MSL in a part overlapping the recess 103 (the gap 104) in the normal direction to the main surface 5a is at least 10% smaller than the characteristic impedance of the first MSL or of the second MSL in a different part.

The input lead 21 and the output lead 22 are plate-shaped conductive (for example, made of a metal) members protruding outward from the side wall 10. In an example, the input lead 21 and the output lead 22 are thin metal plates formed of copper, a copper alloy, or an iron alloy. One end of the input lead 21 in the direction D1 is disposed on the first portion 101 and is conductively bonded to the conductive film 11 with a conductive bonding material therebetween. One end of the output lead 22 in the direction D1 is disposed on the second portion 102 and is conductively bonded to the outer portion 12a of the conductive film 12 with a conductive bonding material therebetween. For example, the conductive bonding material is a Ag—Cu-based brazing material.

The transistor 31 and the matching circuit 32 are accommodated in the package 3 and is mounted in a region surrounded by the side wall 10 on the main surface 5a of the base member 5. The semiconductor device 1A can be used when the side wall 10 of the package 3 is covered with a lid. Hermetic sealing may be performed by covering the side wall 10 with a lid in a state in which the internal space of the package 3 is subjected to nitrogen substitution.

The matching circuit 32 and the transistor 31 are provided in this order from the first portion 101 to the second portion 102 of the side wall 10. For example, the transistor 31 is a transistor including a substrate formed of Si, SiC, GaN, GaAs, diamond, or the like, and the rear surface of the substrate is subjected to metal plating. In an example, the transistor 31 is GaN-HEMT. The matching circuit 32 performs impedance matching between the input lead 21 and the transistor 31. For example, the matching circuit 32 is a parallel flat plate capacitor realized by providing an electrode on each of an upper surface and a lower surface of a ceramic substrate. Alternatively, the matching circuit 32 may be a capacitor formed to have a Si-MOS structure.

The matching circuit 32 and the transistor 31 have a rear surface subjected to metal plating (for example, gold plating) and are fixed to the main surface 5a of the base member 5 with a conductive bonding material (for example, a sintered metal paste) therebetween. The input lead 21 and the conductive film 11 are electrically connected to the matching circuit 32 through a plurality of bonding wires 41. The matching circuit 32 is electrically connected to the transistor 31 through a plurality of bonding wires 42. That is, the transistor 31 is electrically connected to the input lead 21 and the conductive film 11 through the bonding wires 42, the matching circuit 32, and the bonding wires 41. The transistor 31 is electrically connected to and the conductive film 12 through a plurality of bonding wires 43.

In the foregoing example, the matching circuit 32 and the transistor 31 are provided in this order from the first portion 101 to the second portion 102 of the side wall 10, but the order is not limited thereto. For example, they may be provided in the order of the transistor and the matching circuit from the first portion 101 to the second portion 102. In such a case, the matching circuit performs impedance matching between the output lead 22 and the transistor 31. Alternatively, matching circuits may be respectively provided on both sides of a transistor. In this case, one matching circuit performs impedance matching between the input lead 21 and the transistor 31, and the other matching circuit performs impedance matching between the output lead 22 and the transistor 31.

Operation effects of the semiconductor device 1A of the present embodiment having the foregoing configuration will be described. In this semiconductor device 1A, the side wall 10 has the recess 103 on the back surface 10b facing the base member 5. The gap 104 formed by the recess 103 is present between the side wall 10 below the conductive film 14 and the base member 5. Accordingly, the portion 14a of the conductive film 14 electrically connected to the main surface 5a of the base member 5 can be provided on the inner surface of this recess 103. When such a portion 14a of the conductive film 14 is provided, the thickness of the dielectric of the second MSL in the part of the side wall 10 becomes thinner than those in other portions, and thus the electrostatic capacity of the second MSL increases. As a result, the electrical length can be elongated. That is, the electrical length of the second MSL of the package 3 can be further elongated regardless of the size of the package 3, and the electrical length of the entire MSL including a wiring substrate on which the semiconductor device 1A is mounted can be easily adjusted.

Particularly, when the side wall 10 is made of a ceramic and the dielectric substrate constituting a mounting substrate is made of a resin (for example, of glass epoxy), the dielectric constant of the side wall 10 is larger than that of the dielectric substrate. Thus, the foregoing effects can be performed more remarkably.

Figure 4A:
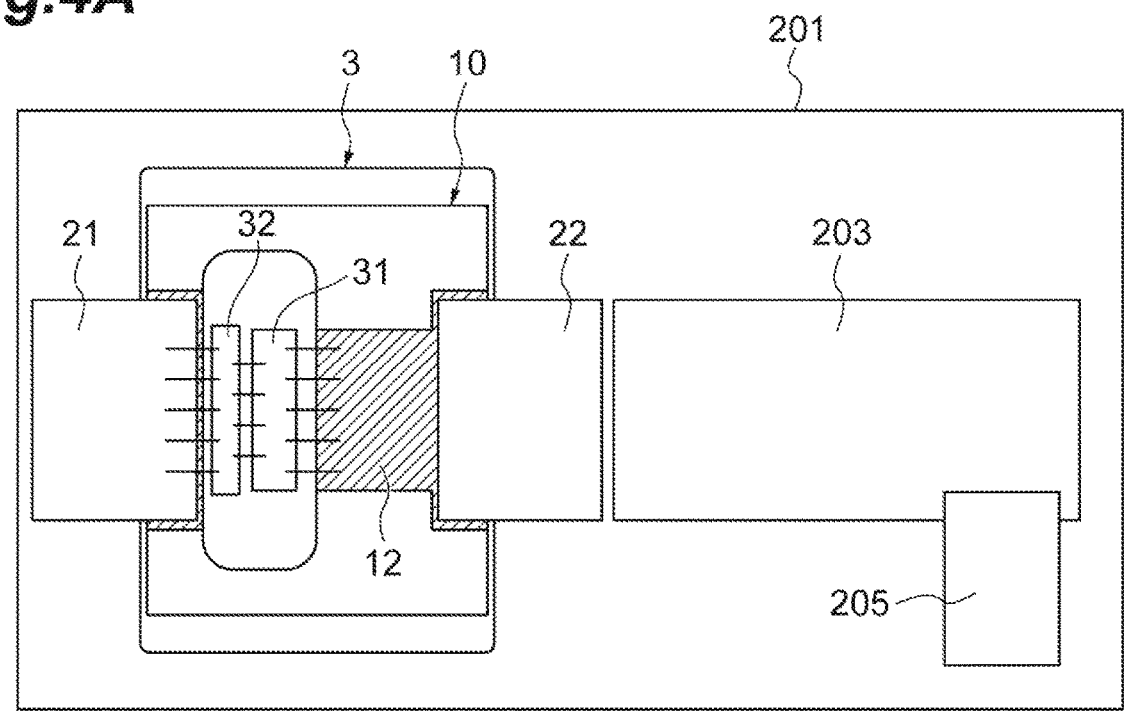
FIG. 4A shows a configuration in a case of a side wall provided with no recess and FIG. 4B shows a configuration in a case of a side wall provided with a recess.
Figure 4B:
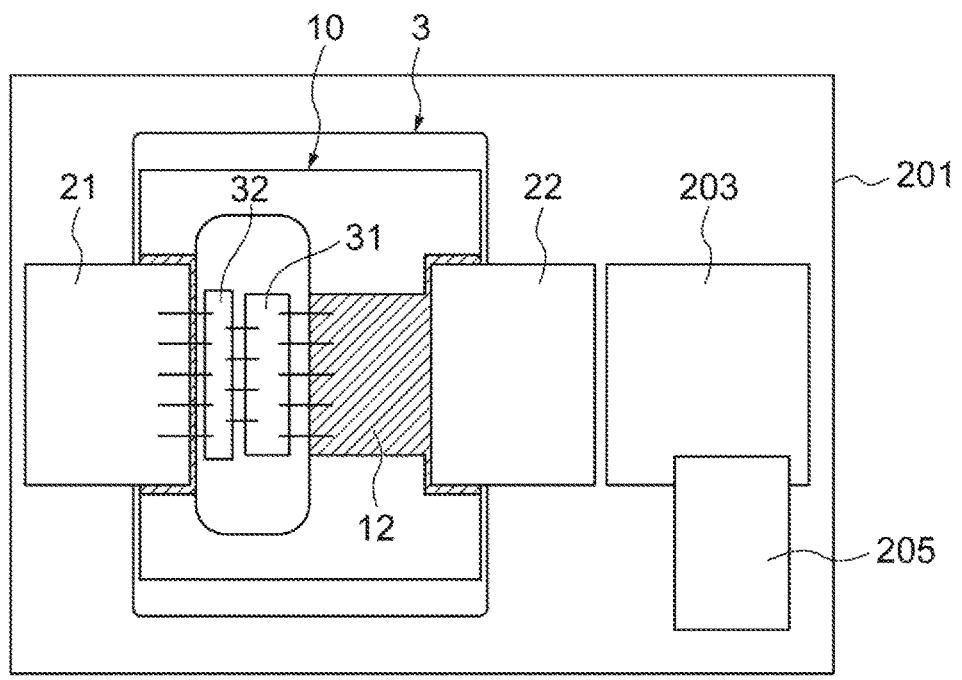

FIGS. 4A and 4B are views for describing examples of effects of the present embodiment. FIG. 4A shows a case of the side wall 10 provided with no recess 103, and FIG. 4B shows a case of the side wall 10 provided with the recess 103. When the package 3 is mounted on a wiring substrate 201, outside the package 3, an MSL is constituted of a dielectric substrate (for example, of glass epoxy) constituting the wiring substrate 201, a wiring pattern 203 provided on the front surface of the dielectric substrate, and a wiring pattern (not shown in the diagram) provided on the rear surface of the dielectric substrate. An external matching circuit is constituted of this MSL and a capacitor 205.

Since the dielectric substrate constituting the wiring substrate 201 is considerably thicker than the side wall 10 of the package 3, the electrostatic capacity of the MSL of the wiring substrate 201 is relatively small. Thus, the MSL of the wiring substrate 201 tends to be longer than the MSL of the package 3. For example, on the wiring substrate 201 having a relative dielectric constant of 4, a thickness of 0.5 mm, and a line conductor thickness of 35 μm, the length of a 80 /4-long transmission line corresponding to the frequency of 2 GHz is 21.6 mm. If the MSL of the wiring substrate 201 becomes long, an area necessary for the external matching circuit (the wiring pattern 203 and the capacitor 205) in the wiring substrate 201 increases as shown in FIG. 4A. Further, this leads to increase in size of the entire device including the wiring substrate 201. In contrast, in the present embodiment, the electrical length of the MSL of the package 3 can be further elongated as described above, and thus the MSL of the wiring substrate 201 can be shortened as much as the increased length. Thus, as shown in FIG. 4B, the area necessary for the external matching circuit (the wiring pattern 203 and the capacitor 205) in the wiring substrate 201 is reduced, and this can contribute to size reduction of the entire device including the wiring substrate 201. Such a configuration is particularly effective when the dimensions of the package 3 are adapted to a range near a certain frequency band (for example, within a range of 1 GHz to 2 GHz) in a case of using the package 3 at a frequency band (for example, within a range of 700 MHz to 1 GHz) shorter (having a longer wavelength) than the frequency band.

As in the present embodiment, the second MSL is constituted of the conductive film 12, the side wall 10, and a part of the main surface 5a of the base member 5. The characteristic impedance of the second MSL in the part overlapping the gap 104 in the normal direction to the main surface 5a may be at least 10% smaller than the characteristic impedance of the first MSL or of the second MSL in a different part. Accordingly, it is possible to perform not only impedance matching using a component but also perform impedance matching using only the MSL.

As in the present embodiment, the width of the recess 103 (the gap 104) in the direction D1 intersecting an extending direction of the second portion 102 of the side wall 10 may be equal to or larger than half the width of the second portion 102 in the direction D1. In this way, the amount of change in the electrical length of the second MSL increases by setting the ratio of the recess 103 (the gap 104) to the width of the second portion 102 to a relatively significant amount, and thus the adjustment range of the electrical length can be increased.

As in the present embodiment, both ends of the recess 103 (the gap 104) in the direction D1 intersecting the extending direction of the second portion 102 of the side wall 10 may be closed. In this case, deterioration in mechanical strength of the second portion 102 caused by providing the recess 103 can be curbed. In addition, the sealing state of the package 3 can be favorably maintained. Even when only one of the two ends of the recess 103 in the direction D1 is closed, a similar effect can be performed.

As in the present embodiment, the thickness of the second portion 102 of the side wall 10 in the part where the recess 103 is formed may be equal to or larger than 30% of the thickness of the second portion 102 in a different part. In this case, deterioration in mechanical strength of the second portion 102 caused by providing the recess 103 can be curbed.

As in the present embodiment, the width Wa of the recess 103 in the extending direction D2 of the second portion 102 may be wider than the width Wb of the conductive film 12 in the direction D2. The recess 103 may protrude from both ends of the conductive film 12 in the extending direction D2 of the second portion 102 when viewed in the normal direction of the main surface 5a. In this case, signal transmission characteristics of the second MSL can be made uniform throughout the entire width of the conductive film 12, and influences on a signal waveform or the like can be curbed.

MODIFICATION EXAMPLE

Figure 5:
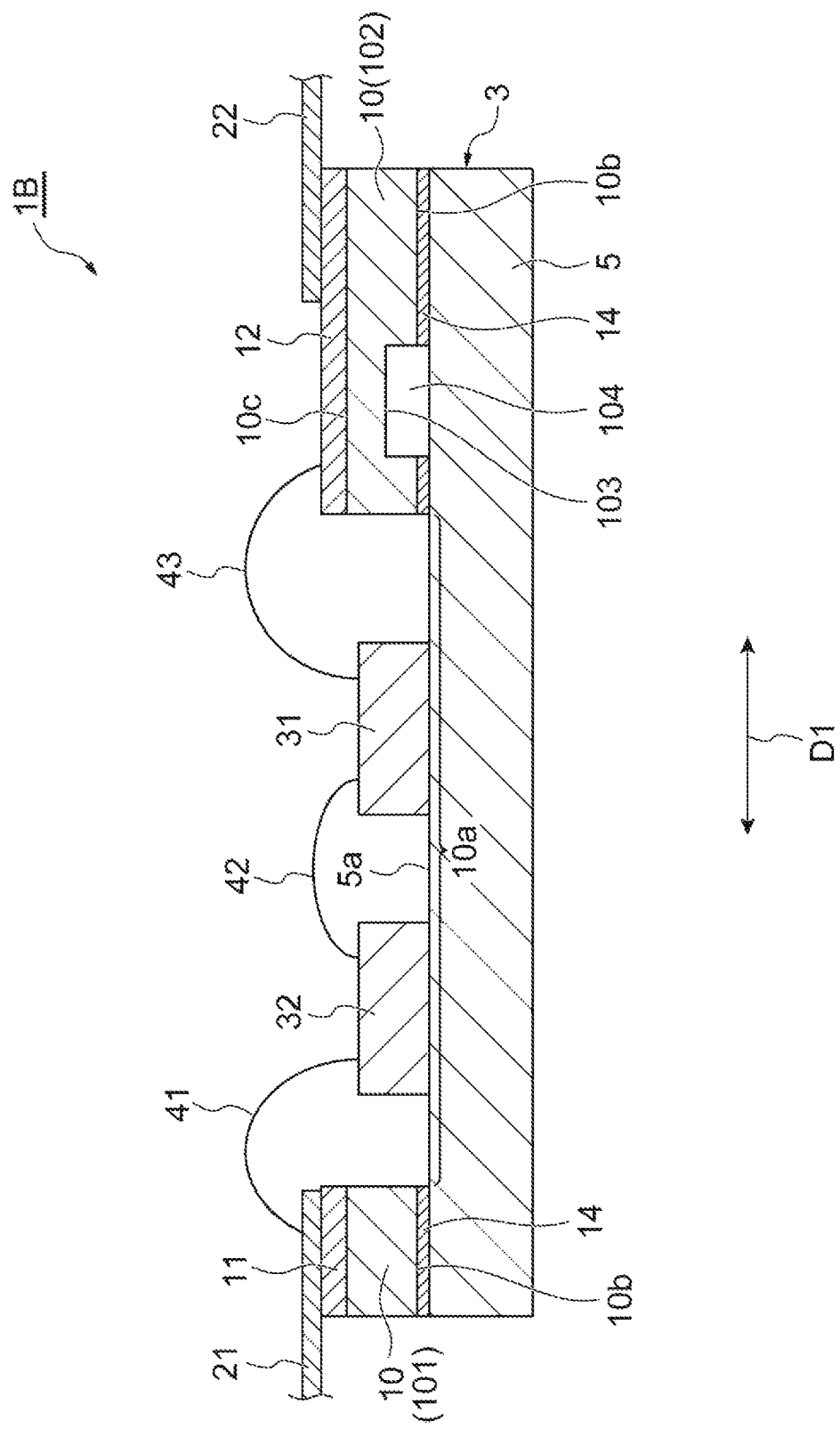
FIG. 5 is a cross-sectional view of a semiconductor device according to a modification example showing a cross section corresponding to line III-III in FIG. 2.

FIG. 5 is a cross-sectional view of a semiconductor device 1B according to a modification example of the foregoing embodiment showing a cross section corresponding to line III-III in FIG. 2. In the present modification example, different from the foregoing embodiment, the conductive film 14 is not provided on the inner surface, which can include a bottom surface and side surfaces, of the recess 103. In other words, the bottom surface of the recess 103 faces the main surface 5a of the base member 5 with only air therebetween.

As in the present modification example, when the conductive film 14 is not provided on the inner surface of the recess 103, the conductive film 12, the second dielectric portion 102, air inside the recess 103, and the main surface 5a of the base member 5 constitute the second MSL on the output side. Since the dielectric constant of air is smaller than the dielectric constant of the side wall 10 (for example, a ceramic), the electrostatic capacity of the second MSL in the part where the gap 104 is present becomes smaller than the electrostatic capacities in other portions. Thus, in the part, the electrical length of the second MSL per unit length becomes shorter than those in other portions. According to the present modification example, the electrical length of the second MSL of the package 3 can be further shortened regardless of the size of the package 3, and the electrical length of the entire MSL including a wiring substrate can be easily adjusted.

Effects of present modification example will be described more specifically. If the electrical length inside a package is excessively long, the phase may rotate (shift excessively) beyond an optimum impedance. In such a case, there is a need to shift the phase extra by half the wavelength in the wiring substrate 201, and thus the electrical length of the MSL of the wiring substrate 201 becomes longer (the state in FIG. 4A). In contrast, in the present modification example, the electrical length of the MSL of the package 3 can be further shortened as described above. Accordingly rotation (excessive shift) of the phase beyond an optimum impedance can be curbed, and the need to shift the phase extra in the wiring substrate 201 can be reduced. Thus, the electrical length of the MSL of the wiring substrate 201 can be shortened (FIG. 4B). Accordingly, the area necessary for the external matching circuit (the wiring pattern 203 and the capacitor 205) in the wiring substrate 201 is reduced. This contributes to size reduction of the entire device including the wiring substrate 201. Moreover, a transmission loss of the MSL can be reduced as much as the amount of the phase which has rotated extra. Such a configuration is particularly effective when the dimensions of the package 3 are adapted to a range near a certain frequency band (for example, within a range of 1 GHz to 2 GHz) in a case of using the package 3 at a frequency band (for example, within a range of 2 GHz to 5 GHz) longer (having a shorter wavelength) than the frequency band.

In the present modification example, the characteristic impedance in a part (a part overlapping the gap 104 in the normal direction of the main surface 5a) where the gap 104 is present increases. The characteristic impedance of the second MSL in the part may be at least 10% larger than the characteristic impedance of the first MSL or of the second MSL in a different part. Accordingly, it is possible to perform not only impedance matching using a component but also perform impedance matching using only the MSL.

First Example

Figure 6:
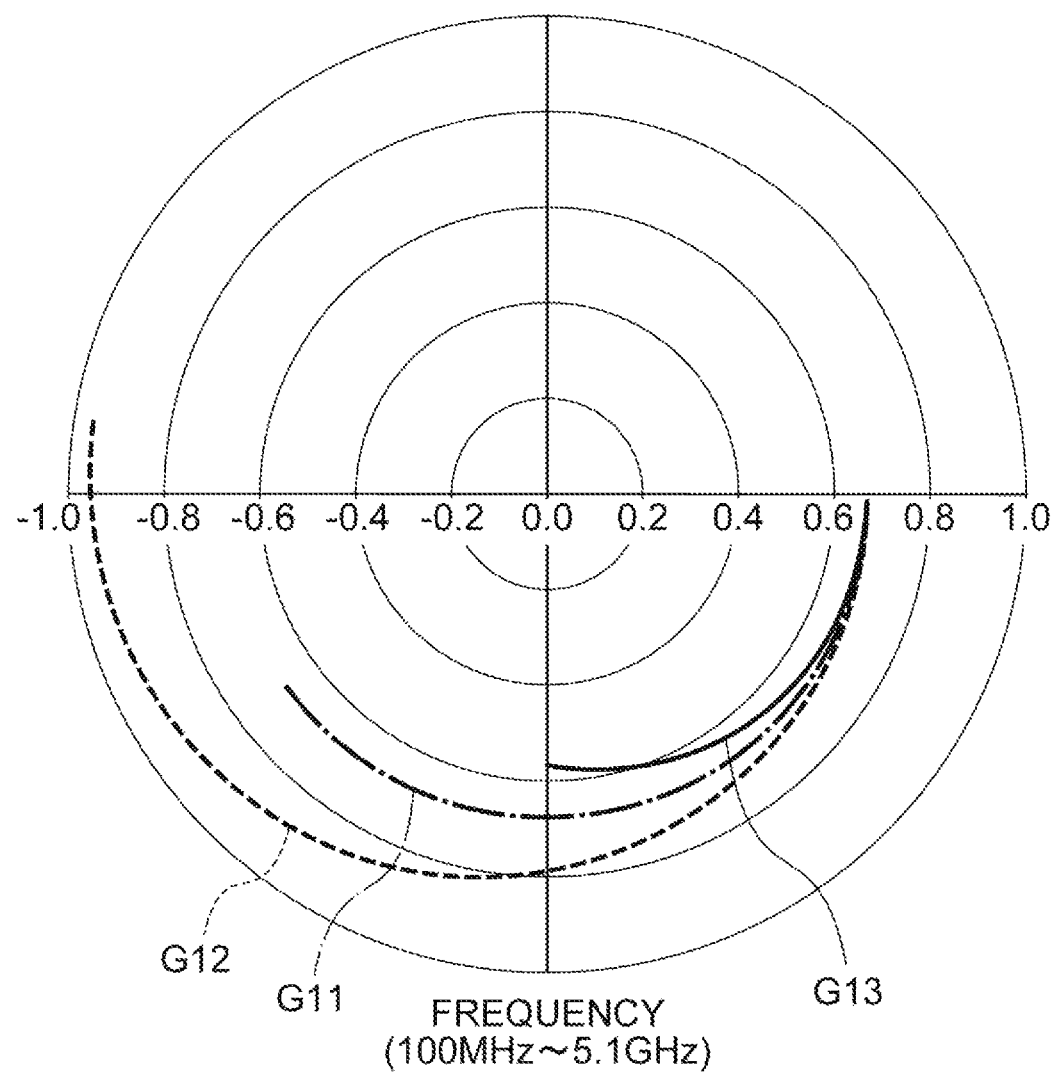
FIG. 6 is a graph showing results in which reflection characteristics ($S_{11}$) in an inner portion (TRL) of a conductive film are estimated for the semiconductor device shown in FIG. 1 and the semiconductor device shown in FIG. 5.

FIG. 6 is a graph (polar chart) showing results in which reflection characteristics ($S_{11}$) in the inner portion 12b (TRL) of the conductive film 12 are estimated for the semiconductor device 1A according to the foregoing embodiment and a semiconductor device 1B according to the foregoing modification example. In FIG. 6, angular positions indicate phases, and radial positions indicate sizes (amplitudes). In the diagram, the graph G11 indicates characteristics of a semiconductor device of a comparative example provided with no gap 104, the graph G12 indicates characteristics of the semiconductor device 1A (the conductive film 14 is provided inside the gap 104) of the foregoing embodiment, and the graph G13 indicates characteristics of the semiconductor device 1B (the conductive film 14 is not provided inside the gap 104) of the foregoing modification example. The frequency is within 100 MHz to 5.1 GHz. The rotation amounts of the graphs G11 to G13 starting from the right end (100 MHz) of the graphs respectively correspond to the electrical lengths. As it is clear from these graphs G11 to G13, in the semiconductor device 1A in which the conductive film 14 is provided inside the gap 104, the electrical lengths become remarkably longer than the case in which the gap 104 is not provided, and in the semiconductor device 1B in which the conductive film 14 is not provided inside the gap 104, the electrical lengths become remarkably shorter than the case in which the gap 104 is not provided. These electrical lengths can be adjusted by changing the height of the gap 104 (the depth of the recess 103) and the width of the gap 104 in the direction D1.

Second Example

Figure 7:
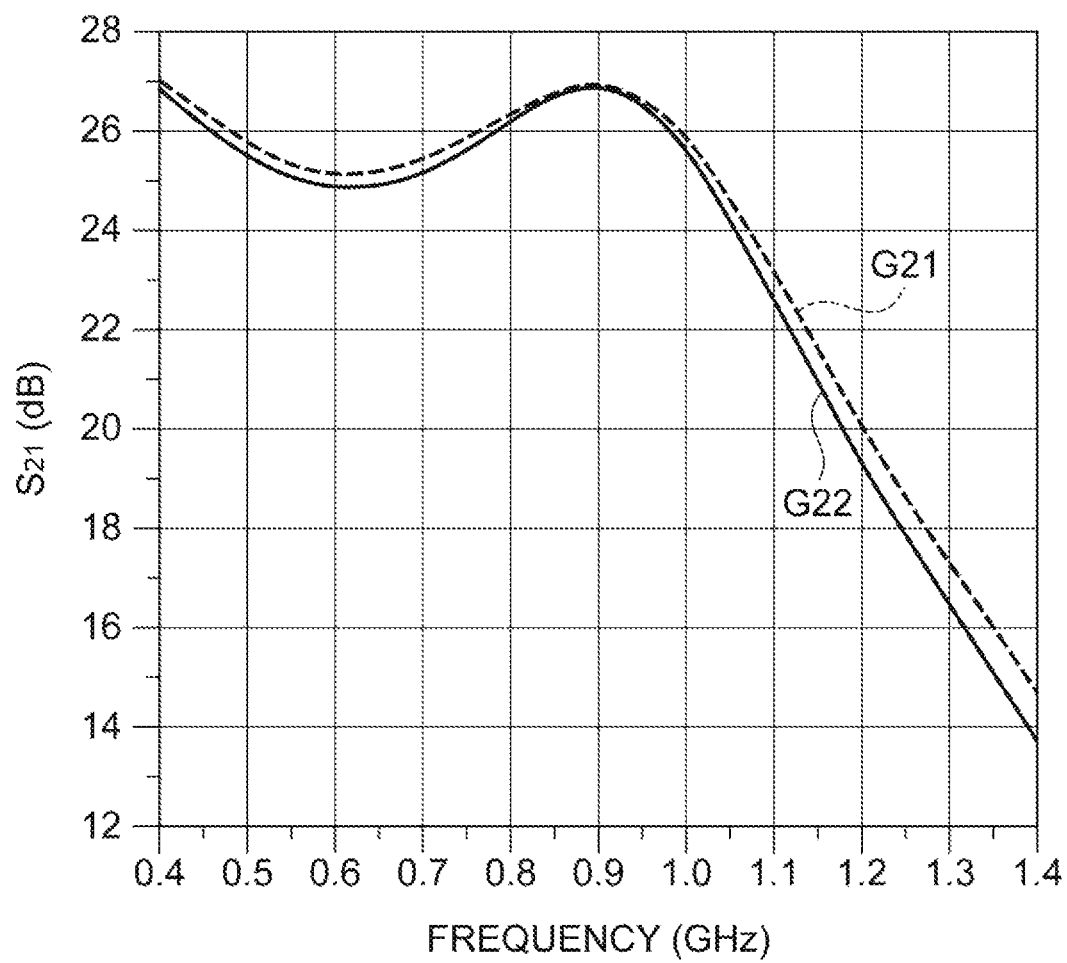
FIG. 7 is a graph showing an example of a simulation performed at a frequency of 900 MHz for each of a device in which the semiconductor device shown in FIG. 1 is mounted on a wiring substrate and a device in which a semiconductor device of a comparative example provided with no gap is mounted on a wiring substrate and showing frequency dependency of transmission characteristics ($S_{21}$)
Figure 8:
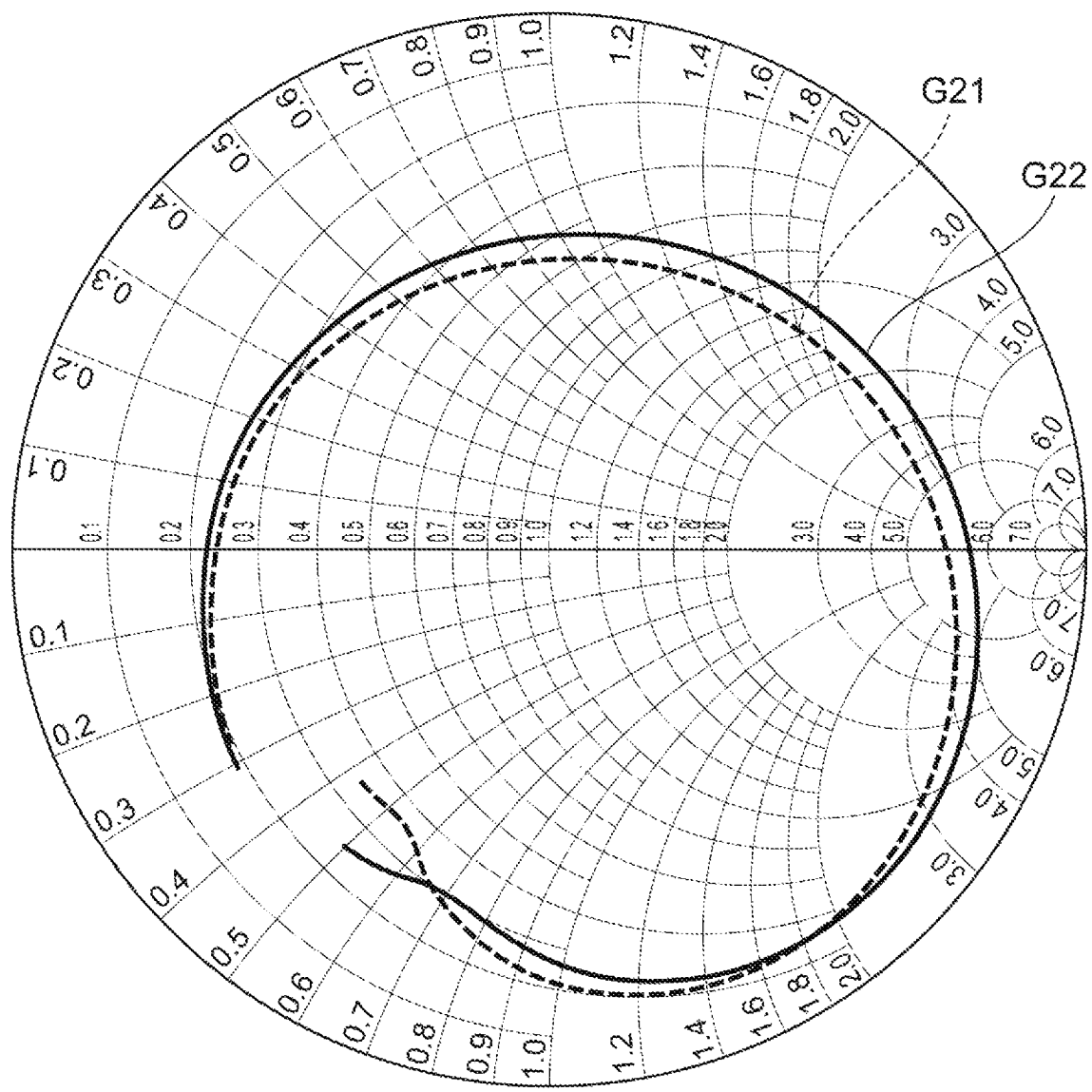
FIG. 8 is a graph showing an example of a simulation performed at a frequency of 900 MHz for each of the device in which the semiconductor device shown in FIG. 1 is mounted on a wiring substrate and the device in which the semiconductor device of the comparative example provided with no gap is mounted on a wiring substrate and is a Smith chart showing the reflection characteristics ($S_{11}$)

FIGS. 7 and 8 are graphs showing an example of a simulation performed at a frequency of 900 MHz for each of a device (refer to FIG. 4B) in which the semiconductor device 1A of the foregoing embodiment is mounted on a wiring substrate and a device (refer to FIG. 4A) in which the semiconductor device of the comparative example provided with no gap 104 is mounted on a wiring substrate. FIG. 7 shows frequency dependency of transmission characteristics ($S_{21}$). FIG. 8 is a Smith chart showing the reflection characteristics ($S_{11}$). In FIG. 8, the frequency is within a range of 400 MHz to 1.4 GHz. In these diagrams, the graph G21 indicates characteristics of the semiconductor device of the comparative example provided with no gap 104, and the graph G22 indicates characteristics of the semiconductor device 1A (the conductive film 14 is provided inside the gap 104) of the foregoing embodiment. Referring to these diagrams, although the MSL of the wiring substrate is shortened in the semiconductor device 1A of the foregoing embodiment, it is ascertained that the transmission characteristics ($S_{21}$) and the reflection characteristics ($S_{11}$) are almost the same as those in the comparative example.

Third Example

Figure 9:
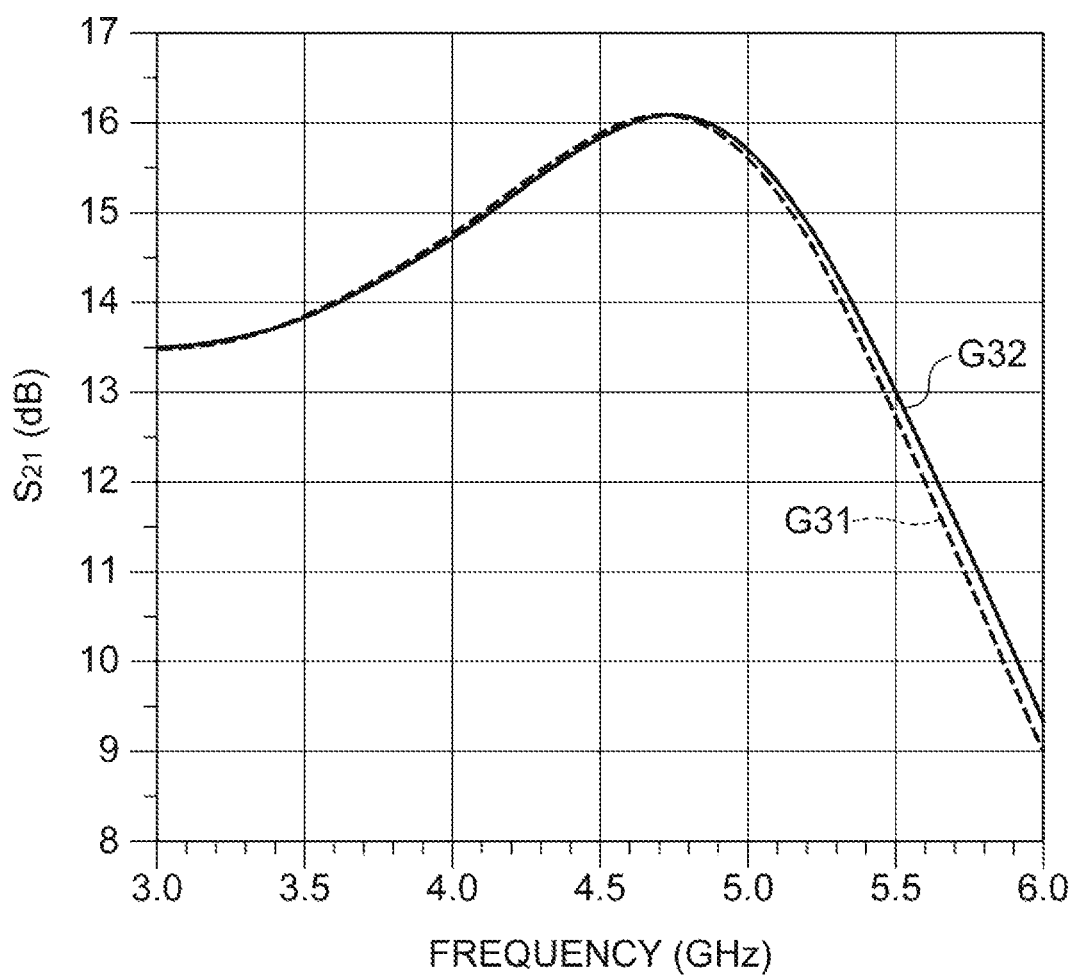
FIG. 9 is a graph showing an example of a simulation performed at a frequency of 4.7 GHz for each of the device in which the semiconductor device shown in FIG. 5 is mounted on a wiring substrate and the device in which the semiconductor device of the comparative example provided with no gap is mounted on a wiring substrate and showing the frequency dependency of the transmission characteristics ($S_{21}$)
Figure 10:
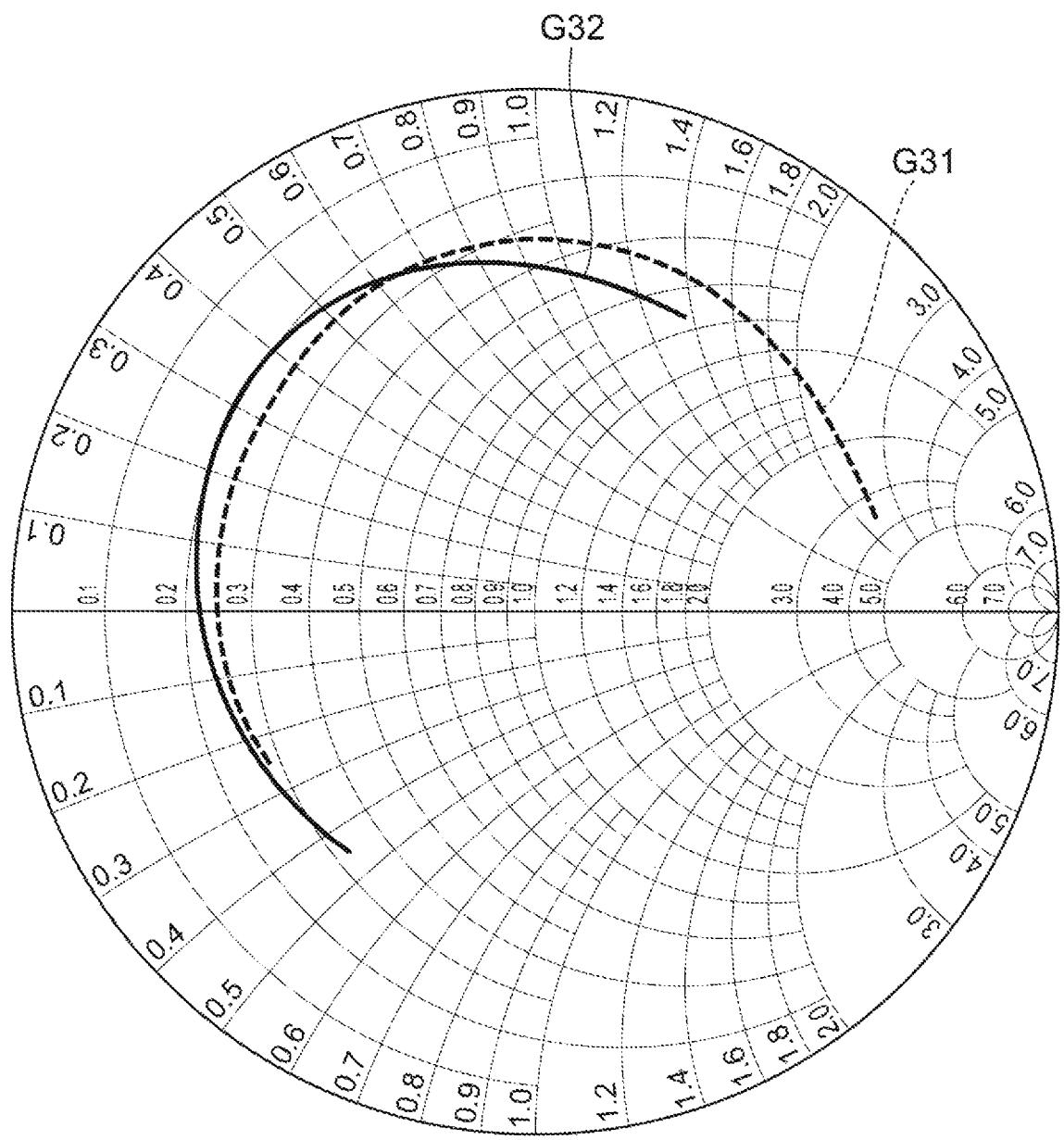
FIG. 10 is a graph showing an example of a simulation performed at a frequency of 4.7 GHz for each of the device in which the semiconductor device shown in FIG. 5 is mounted on a wiring substrate and the device in which the semiconductor device of the comparative example provided with no gap is mounted on a wiring substrate and is a Smith chart showing the reflection characteristics ($S_{11}$).

FIGS. 9 and 10 are graphs showing an example of a simulation performed at a frequency of 4.7 GHz for each of the device in which the semiconductor device 1B of the foregoing modification example is mounted on a wiring substrate and the device in which the semiconductor device of the comparative example provided with no gap 104 is mounted on a wiring substrate. FIG. 9 shows the frequency dependency of the transmission characteristics ($S_{21}$). FIG. 10 is a Smith chart showing the reflection characteristics ($S_{11}$). In FIG. 10, the frequency is within a range of 3 GHz to 6 GHz. In these diagrams, the graph G31 indicates characteristics of the semiconductor device of the comparative example provided with no gap 104, and the graph G32 indicates characteristics of the semiconductor device 1B (the conductive film 14 is not provided inside the gap 104) of the foregoing modification example. In the semiconductor device of the modification example (graph G31), the length of the wiring pattern 203 (FIGS. 4A and 4B) is set to ⅓ of that in the comparative example (graph G32). Referring to these diagrams, although the MSL of the wiring substrate is shortened in the semiconductor device 1B of the foregoing modification example, it is ascertained that the transmission characteristics ($S_{21}$) and the reflection characteristics ($S_{11}$) are almost the same as those in the comparative example.

The semiconductor device according to the present disclosure is not limited to the embodiment described above, and various other modification can be performed. For example, in the foregoing embodiment and the modification example, the side wall 10 defines a single cavity 10a, but a side wall may define a plurality (for example, two) of cavities. In addition, the transistor 31 has been exemplified as a semiconductor die in the foregoing embodiment. The semiconductor device according to the present disclosure is not limited thereto and may include various semiconductor dies.

In the foregoing embodiment and the modification example, the recess 103 is provided in the second portion 102 positioned on the output side in the side wall 10, but the recess 103 may be provided in the first portion 101 positioned on the input side, or the recess 103 may be provided in both the portions 101 and 102. That is, the gap 104 formed by the recess 103 may be present between the side wall 10 below the conductive film 11 (or 12) and the base member 5 in at least one of the pair of portions 101 and 102 of the side wall 10. Accordingly, the electrical length of the MSL can be further elongated or shortened, and the electrical length can be easily adjusted on the input side of the transistor 31 as well.

What is claimed is:

1. A semiconductor device comprising:
    a semiconductor die;
    a base member having a conductive main surface including a region that mounts the semiconductor die thereon;
    a side wall provided on the conductive main surface of the base member and surrounding the region of the conductive main surface, the side wall being made of a dielectric, wherein the side wall includes a first portion and a second portion;
    a first conductive film provided on the first portion of the side wall, the first conductive film being electrically connected to the semiconductor die;
    a second conductive film provided on the second portion of the side wall, the second conductive film being electrically connected to the semiconductor die;
    a first conductive lead conductively bonded to the first conductive film;
    a second conductive lead conductively bonded to the second conductive film;
    wherein at least one of the first portion and the second portion of the side wall has a recess in a back surface thereof that faces the base member, and the recess is configured to define a gap between the at least one of the first portion and the second portion of the side wall below the conductive film corresponding thereto and the base member.

2. The semiconductor device according to claim 1, further comprising;
    a third conductive film provided on an inner surface of the recess, the third conductive film being electrically connected to the main surface of the base member.

3. The semiconductor device according to claim 1,
    wherein the first conductive film, the first portion of the side wall and a part of the main surface of the base member constitute a first microstrip line, and the second conductive film, the second portion of the side wall and a part of the main surface of the base member constitute a second microstrip line,
    wherein the second portion has the recess, and
    wherein a characteristic impedance of the second microstrip line in a part overlapping the recess when viewed in a direction normal to the main surface is at least 10% smaller than a characteristic impedance of the first microstrip line or a characteristic impedance of the second microstrip line in a different part not overlapping the recess in the normal direction.

4. The semiconductor device according to claim 1,
    wherein no conductive film is provided on an inner surface of the recess between the side wall and the base member.

5. The semiconductor device according to claim 1,
    wherein the first conductive film, the first portion of the side wall and a part of the main surface of the base member constitute a first microstrip line, and the second conductive film, the second portion of the side wall and a part of the main surface of the base member constitute a second microstrip line, wherein the second portion has the recess, and wherein a characteristic impedance of the second microstrip line in a part overlapping the recess when viewed in a direction normal to the main surface is at least 10% higher than a characteristic impedance of the first microstrip line or a characteristic impedance of the second microstrip line in a different part not overlapping the recess in the normal direction.

6. The semiconductor device according to claim 1, wherein the recess is in the second portion of the side wall, and wherein the recess is equal to or wider than a half of a width of the second portion of the side wall, in a direction intersecting an extending direction of the second portion of the side wall.

7. The semiconductor device according to claim 1, wherein the recess is in the second portion of the side wall, and wherein at least one of both ends of the recess is closed in a direction intersecting an extending direction of the second portion of the side wall.

8. The semiconductor device according to claim 1, wherein the second portion of the side wall has the recess, and wherein the second portion has a thickness in a part where the recess is formed, the thickness being equal to or larger than 30% of a thickness of the side wall in a different part thereof.

9. The semiconductor device according to claim 1, wherein the recess is in the second portion of the side wall, and wherein a width of the recess is wider than a width of the second conductive film in an extending direction of the second portion so that the recess spreads out of both ends of the second conductive film when viewed from a direction normal to the main surface.

10. The semiconductor device according to claim 1, wherein the recess is in the second portion of the side wall, wherein the second conductive film includes an outer portion positioned near an outer edge of the second portion, and an inner portion positioned near an inner edge of the second portion, and the inner portion has a shorter width than a width of the outer portion in an extending direction of the second portion, and wherein the inner portion of the second conductive film overlaps the recess when viewed from a direction normal to the main surface.

11. The semiconductor device according to claim 10, wherein the width of the outer portion of the second conductive film is substantially the same as a width of the first conductive film in the extending direction of the second portion.

12. The semiconductor device according to claim 10, wherein a length of the inner portion of the second conductive film is longer than a length of the outer portion of the second conductive film in a direction intersecting the extending direction of the second portion.

13. The semiconductor device according to claim 1, wherein the second portion has the recess and, wherein a width of the second portion is longer than a width of the first portion in a direction intersecting an extending direction of the second portion.

14. The semiconductor device according to claim 1, wherein the recess is in the second portion of the side wall, and wherein a length of the second conductive film is longer than a length of the first conductive film in a direction intersecting an extending direction of the second portion.

15. The semiconductor device according to claim 1, further comprising:

a matching circuit disposed on the region of the conductive main surface of the base member between the semiconductor die and the first portion of the side wall, wherein the semiconductor die is electrically connected to the first conductive lead through the matching circuit so that the matching circuit performs impedance matching between the semiconductor die and the first conductive lead.

* * * * *